(12) United States Patent
Liu

(10) Patent No.: US 9,965,345 B2
(45) Date of Patent: May 8, 2018

(54) HEALTH MANAGEMENT OF NON-VOLATILE MEMORY

(71) Applicant: Macronix International Co., Ltd., Hsinchu (TW)

(72) Inventor: Yi Chun Liu, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 270 days.

(21) Appl. No.: 14/686,317

(22) Filed: Apr. 14, 2015

(65) Prior Publication Data

US 2016/0085612 A1 Mar. 24, 2016

Related U.S. Application Data

(60) Provisional application No. 62/054,514, filed on Sep. 24, 2014.

(51) Int. Cl.
*G06F 11/00* (2006.01)
*G06F 11/07* (2006.01)
(Continued)

(52) U.S. Cl.
CPC .......... *G06F 11/073* (2013.01); *G06F 3/0619* (2013.01); *G06F 3/0649* (2013.01); *G06F 3/0679* (2013.01); *G06F 11/076* (2013.01); *G06F 11/079* (2013.01); *G06F 11/0793* (2013.01); *G11C 29/789* (2013.01); *H03M 7/42* (2013.01); *H03M 2201/834* (2013.01); *H04L 1/0016* (2013.01)

(58) Field of Classification Search
CPC .... G06F 3/0679; G06F 3/0688; G06F 3/0619; G06F 3/0649; G06F 7/5057; G06F 11/076; G06F 11/073; H03M 7/42; H03M 2201/834; H04L 1/0016; G11C 29/789
USPC ................ 714/752, 755, 763, 759, 768, 773
See application file for complete search history.

(56) References Cited

U.S. PATENT DOCUMENTS 9,480,075 B2 * 10/2016 Hirata ...................... H04L 1/00
2007/0245064 A1 10/2007 Liu
(Continued)

FOREIGN PATENT DOCUMENTS

| CN | 101510168 | 6/2012 |
|---|---|---|
| CN | 103544073 | 1/2014 |

*Primary Examiner* — Shelly A Chase
*Assistant Examiner* — Osman M Alshack
(74) *Attorney, Agent, or Firm* — Finnegan, Henderson, Farabow, Garrett & Dunner LLP

(57) ABSTRACT

An apparatus for controlling programming of a non-volatile memory including at least one block partitioned into a plurality of physical sections, each of the physical sections including a plurality of memory cells, the apparatus including a controller configured to access a table including information corresponding to individual ones of the plurality of physical sections. The controller is configured to identify a first programming method for a first physical section of the plurality of physical sections and identify a second programming method for a second physical section of the plurality of physical sections according to information in the table corresponding to the first and second physical sections. The controller is also configured to program the first and second physical sections according to the first and second programming methods for the first and section physical sections, respectively.

13 Claims, 5 Drawing Sheets

(51) Int. Cl.
*G06F 3/06* (2006.01)
*H03M 7/42* (2006.01)
*G11C 29/00* (2006.01)
*H04L 1/00* (2006.01)

(56) References Cited

U.S. PATENT DOCUMENTS

| | | | |
|---|---|---|---|
| 2010/0131806 A1* | 5/2010 | Weingarten | G06F 11/1072 714/54 |
| 2012/0072805 A1* | 3/2012 | Tseng | G06F 11/008 714/773 |
| 2012/0144267 A1* | 6/2012 | Yeh | G06F 11/1072 714/763 |
| 2012/0179859 A1 | 7/2012 | Kim et al. | |
| 2012/0198135 A1* | 8/2012 | Chilappagari | G11C 11/5621 711/103 |
| 2012/0226963 A1* | 9/2012 | Bivens | G11C 29/42 714/773 |
| 2012/0268994 A1* | 10/2012 | Nagashima | G06F 11/1048 365/185.11 |
| 2013/0159797 A1* | 6/2013 | Peng | G11C 16/349 714/718 |
| 2013/0198589 A1* | 8/2013 | Choi | G06F 11/1072 714/773 |
| 2013/0212315 A1* | 8/2013 | Steiner | G06F 12/0246 711/103 |
| 2014/0026011 A1 | 1/2014 | Huang et al. | |
| 2014/0026018 A1 | 1/2014 | Yang et al. | |
| 2014/0075265 A1 | 3/2014 | Hung et al. | |
| 2014/0082440 A1 | 3/2014 | Ho et al. | |
| 2014/0229799 A1 | 8/2014 | Hubris et al. | |
| 2014/0245097 A1 | 8/2014 | Larsen et al. | |
| 2014/0269074 A1* | 9/2014 | Kuo | G11C 16/10 365/185.12 |
| 2014/0281803 A1 | 9/2014 | Hsueh et al. | |
| 2014/0344641 A1* | 11/2014 | Jeong | G06F 11/073 714/759 |
| 2015/0058700 A1* | 2/2015 | Yang | G06F 11/108 714/773 |
| 2015/0378801 A1* | 12/2015 | Navon | G06F 11/076 714/704 |

* cited by examiner

| Physical Unit | PU-0 | PU-1 | PU-2 | ... | PU-Y |
|---|---|---|---|---|---|
| Health Data | 0 0 | 0 1 | 1 1 | ... | 1 0 |
| Address | Phy-X$_0$ | Phy-X$_1$ | Phy-X$_2$ | ... | Phy-X$_N$ |

202 — Physical Unit
204 — Health Data
206 — Address
200

A
Health Data  00 — 3 b/c
01 — 2 b/c
10 — 1 b/c
11 — Retire

B
00 — BCH
01 — LDPC
10 — Parity
11 — Retire

FIG. 2

| STATE | MSB | CSB | LSB |
|---|---|---|---|
| 0 | 1 | 1 | 1 |
| 1 | 0 | 1 | 1 |
| 2 | 0 | 0 | 1 |
| 3 | 0 | 0 | 0 |
| 4 | 0 | 1 | 0 |
| 5 | 1 | 1 | 0 |
| 6 | 1 | 0 | 0 |
| 7 | 1 | 0 | 1 |

HEALTH MANAGEMENT OF NON-VOLATILE MEMORY

BENEFIT CLAIM

This disclosure claims benefit under 35 U.S.C. § 119(e) of U.S. provisional patent application No. 62/054,514 filed on Sep. 24, 2014, entitled "Adaptive Health Management in a Non-Volatile Memory." The aforementioned application is incorporated herein by reference in its entirety.

TECHNOLOGY FIELD

This disclosure relates to managing degraded sections in non-volatile memories and, more particularly, to methods for adjusting programming of the degraded sections.

BACKGROUND

In a non-volatile (NV) memory, an individual memory cell may include a single charge storing transistor. As an example of NV memory, in a NAND type flash memory, a plurality of memory cells are arranged in an array including a plurality of rows and columns of interconnected memory cells. The memory cells are interconnected by a plurality of word lines and bit lines, each cell in a row being connected by a common word line, for example, and each cell in a column being connected by at least one common bit line. The common word line is typically connected to a gate of each transistor of a memory cell in the row, while the common bit line is typically connected to a source or drain of each transistor of a memory cell in the column.

In some NV memory, such as, for example, the NAND type flash memory, the plurality of memory cells may be managed or controlled according to a hierarchical structure. For example, an array of memory cells are grouped into one or more blocks, and each block is divided into one or more physical pages, each corresponding to a word line. A physical page is the basic programming unit in a NV memory, such that the group of memory cells constituting a physical page can be programmed together during a programming process, such as a write operation. The number of memory cells constituting a physical page may be determined based on the number of memory cells controlled by a common word line. In some hierarchies, the memory cells of a common word line (i.e., physical page) may be divided into more than one physical unit. Additionally, a physical unit may include memory cells controlled by more than one word line.

Memory cells of a flash memory are typically programmed and erased by applying a particular voltage to the word line and one or more bit lines of the targeted memory cells to be programmed or erased. Over time, a plurality of program/erase operations may wear on the transistors making up the memory cells causing them to change properties, resulting in a bit error in a memory cell and potentially in neighboring memory cells. This wear or degradation of the transistors can change the performance and reliability of the plurality of memory cells, potentially making them unusable. A useful life of a NV memory is commonly represented by the number of program/erase cycles (P/E) that a memory cell can withstand before the memory cell becomes unusable. In some systems, once a memory cell has experienced a predetermined number of P/E cycles or demonstrated degraded properties, the memory cells are considered unusable and retired from future use.

Typically, in a NV memory, such as flash memory, a logical-to-physical mapping of memory cells is designed at a block level. Thus, when some memory cells of a block become unusable, the hierarchical block including the degraded or unusable memory cells is retired even if not all of the memory cells of the block are degraded or unusable. And as block sizes are becoming larger and larger in NV memory devices, this conventional block retirement scheme imposes a significant penalty on the storage capabilities of the memory device. Because the degree of wear or degradation of the memory cells constituting individual physical pages may vary considerably within a single block (e.g., due to uneven P/E operations on the physical pages), the conventional block retirement schemes may unnecessarily retire usable memory cells, resulting in wasted storage capacity.

SUMMARY

In accordance with the disclosure, there is provided an apparatus for controlling programming of a non-volatile memory. The memory includes at least one block partitioned into a plurality of physical sections, each of the physical sections including a plurality of memory cells. The apparatus includes a controller configured to access a table including information corresponding to individual ones of the plurality of physical sections. The controller is also configured to identify a first programming method for a first physical section of the plurality of physical sections according to information in the table corresponding to the first physical section, and identify a second programming method for a second physical section of the plurality of physical sections according to information in the table corresponding to the second physical section. The controller is also configured to program the first and second physical sections according to the first and second programming methods for the first and second physical sections, respectively.

Also in accordance with the disclosure, there is provided a method for programming a non-volatile memory including a plurality of blocks, each block including a plurality of physical sections, each of the plurality of physical sections including a plurality of memory cells. The method includes receiving a control signal for a programming operation on one or more of the physical sections, and accessing a table including information corresponding to the one or more physical sections. Further, the method includes identifying a first programming method for a first physical section of the one or more physical sections according to information in the table corresponding to the first physical section, and identifying a second programming method for a second physical section of the one or more physical sections according to information in the table corresponding to the second physical section. The method also includes programming the first and second physical sections according to the first and second programming methods for the first and section physical sections, respectively.

Additionally, there is provided a system for controlling a programming of memory. The system includes a non-volatile memory device including at least one block partitioned into a plurality of physical sections, each of the physical sections including a plurality of memory cells. The system also includes a table including information corresponding to individual ones of the plurality of physical sections and a controller for controlling programming of the non-volatile memory device. The controller is configured to receive a control signal for a programming operation on one or more of the physical sections, and access the table to identify information corresponding to the one or more physical sections. The controller is also configured to identify a first programming method for a first physical section of the one or more physical sections according to the information corresponding to the first physical section, and identify a second programming method for a second physical section of the one or more physical sections according to the information corresponding to the second physical section. The controller is further configured to program the first and second physical sections according to the first and second programming methods for the first and section physical sections, respectively.

Features and advantages consistent with the disclosure will be set forth in part in the description that follows, and in part will be obvious from the description, or may be learned by practice of the disclosure. Such features and advantages may be realized and attained by means of the elements and combinations particularly set out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIG. 2 shows an exemplary health table provided for a plurality of physical sections of a memory according to an exemplary embodiment.

DETAILED DESCRIPTION OF THE EMBODIMENTS

Embodiments consistent with the disclosure include systems and methods for managing and controlling a non-volatile (NV) memory by dynamically adapting or adjusting programming and/or error correction methods for individual physical sections of the memory based on a determined health status of the physical sections. The memory may include a health table identifying degrading physical sections among a plurality of physical sections to enable a controller to determine a desired programming or error correction method to implement for each of the physical sections. The health table of the disclosed systems and methods may include health data for individual physical sections of a plurality of physical sections included in a block of a memory array. According to a health status of the physical section indicated in the health table, the disclosed embodiments may dynamically adjust a programming method of and/or retire individual physical sections of a block of memory as the physical sections degrade and/or become unusable. Thus, consistent with the disclosed embodiments, the storage capacity of a block of memory cells may be adjusted over time according to the adapted programming methods or retirement of individual physical sections. As such, certain degraded or unusable memory cells of a memory array may be retired without retiring the entire block of the memory array.

Additionally, in other embodiments, an error correction scheme may be adjusted over time to detect and correct for a greater number of errors resulting in degrading physical sections of a block of memory array. As such, a useful life of individual physical sections of a memory array may be extended without prematurely retiring the physical section or an entire block of the memory array.

Hereinafter, embodiments consistent with the disclosure will be described with reference to the drawings. Wherever possible, the same reference numbers will be used throughout the drawings to refer to the same or like parts.

Figure 1:
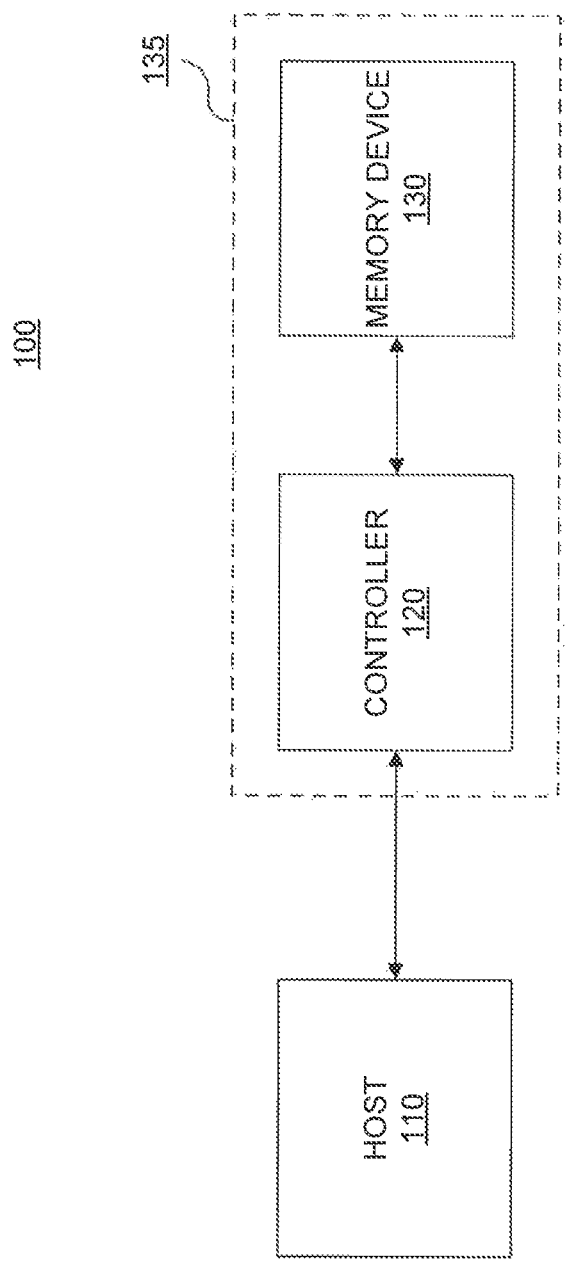
FIG. 1 schematically shows an apparatus for controlling programming of a memory according to an exemplary embodiment.

FIG. 1 schematically illustrates an exemplary apparatus 100 for managing and controlling programming (and other operations) of a memory device 130, consistent with embodiments of the disclosure. The apparatus 100 includes a host 110, one or more memory controllers 120, and one or more memory devices 130. In one embodiment, the one or more memory controllers 120 are provided as part of a managed memory device 135 together with the one or more memory devices 130. In another embodiment, the one or more memory controllers 120 are independent controllers provided as part of host 110. Additionally, in some embodiments, one or more memory controllers 120 and the one or more memory devices 130, as well as a managed memory 135 are included as part of host 110.

Host 110 of the disclosed embodiments may include any host system or computing device, such as a desktop, laptop, or tablet computer, a digital camera, mobile phone, a memory card reader, robotic device, or any other computing device configured to access (e.g., read or write) data to/from memory device 130. Host 110 may include any number of other known components and circuitry for accessing memory device 130, including the one or more memory controllers 120.

The one or more memory controllers 120 are configured to perform the methods consistent with embodiments of this disclosure for managing and controlling the programming of memory device 130. The one or more memory controllers 120 may include any number and combination of components and circuitry configured to perform the methods of the disclosed embodiments as well as other processes such as error correction and read, write and erase operations, mapping, and re-mapping among others, as would be known to one of ordinary skill in the art. For example, controller 120 may include one or more state machines, register files, and other logic circuitry. The logic circuitry may be dedicated circuitry or programmable gate array circuits, or may be implemented as a programmable processor or microprocessor with associated software instructions. The one or more controllers 120 may include any combination of these and other known components and may be provided as a single device such as a microcontroller or may be implemented as multiple independent devices. Any configuration of the one or more memory controllers 120 as would be known to one of ordinary skill in the art as capable of performing the disclosed methods may be implemented.

According to the exemplary embodiments, the one or more controllers 120 may include any of a number of suitable I/O interfaces for communicatively coupling controller 120 to host 110 and/or memory device 130. Controller 120 may be communicatively coupled to memory device 130 by way of an I/O bus and or a control bus for communicating control signals and/or commands for addressing or performing the exemplary methods described below.

The one or more memory devices 130 may include any type of memory device including, but not limited to, non-volatile NAND or NOR type flash memory, phase-change memory (PCM), resistive random-access-memory (RRAM) or any other type of NV memory technology now known or to be developed. In particular, any type of memory that may experience levels of wear (uniform or non-uniform) among individual memory cells or physical sections of a memory device may benefit from the disclosed systems and methods.

Additionally, the one or more memory devices 130 may be programmable and managed according to any known method. For example, in some embodiments, the one or more memory devices 130 may include a plurality of triple-level cells (TLC), i.e., memory cells that are capable of encoding 3 bits of data. In a TLC memory device, individual memory cells may be programmed to hold a particular charge, for example, according to 8 discrete states corresponding to the number of programming states that can encode 3 bits of data. In other embodiments, the one or more memory devices 130 may include a plurality of multi-level cells (MLC), i.e., memory cells that are capable of representing four programming states corresponding to 2 bits of encoded data. And in other embodiments, the one or more memory devices 130 may include a plurality of single-level cells (SLC) that are capable of representing two programming states corresponding to 1 bit of encoded data. Memory device 130 may also be capable of storing 4 or more bits per cell as advances continue to be made in memory technology. The disclosed embodiments are not limited to a particular configuration of memory device 130.

In an exemplary embodiment, the individual memory cells of a memory device 130 may be capable of representing stored data in a number of different programming states encoded according to each of a TLC, MLC or SLC type encoding scheme. For example, in these embodiments, the one or more controllers 120 may be configured to program individual memory cells of memory device 130 according to a programming or encoding scheme corresponding to either 3 bits, 2 bits or a single bit of data. In an exemplary embodiment, the one or more controllers 120 may be adaptable to adjust a programming and read method according to the number of bits to be programmed or read from the plurality of memory cells. For example, in some embodiments, certain of the individual cells that comprise a memory array of memory device 130 may be programmed according to a desired programming scheme to encode 3 bits of data (i.e. as TLCs) whereas other individual cells may be programmed to encode 2 bits or 1 bit of data. As described with respect to FIG. 2 below, the one or more controllers 120 may be configured to manage the plurality of cells comprising a memory array by implementing a health table 200 that stores information identifying, for example, the number of payload or data bits written to the memory cells of individual physical sections of a memory array.

In other embodiments, the one or more controllers 120 and memory devices 130 may be configured to implement various error correction schemes. In some embodiments, controller 120 or memory device 130 may include error correction logic to perform any of one or more error correction schemes known in the art, such as, for example, a Hamming code, multi-dimensional parity-check code, Reed-Solomon codes, BCH code (Bose-Chaudhuri-Hocquenghem), Turbo code, low-density parity-check code (LDPC), and other adaptive error correction schemes. In an exemplary embodiment, the one or more controllers 120 may be configured to be adaptable to implement different error correction schemes for various physical sections of a memory array. For example, in one embodiment, controller 120 may be configured to perform a BCH error correction scheme for a first physical section of a memory array, and an LDPC error correction scheme for a second physical section of the memory array. Controller 120 may be configured to manage error correction for a memory array by accessing health table 200 that stores information identifying which error correction scheme is to be implemented for which of the plurality of physical sections of a memory array.

The one or more memory devices 130 may be configured to store personal data or other usable payload data according to a desired configuration. Additionally, the one or more memory devices 130 may be configured to store metadata or overhead data in addition to the payload data, such as a logical-to-physical mapping table or other addressing data, as well as error correction codes, for example. According to some embodiments, the one or more memory devices 130 may be configured to store additional data in the form of health table 200, as described with respect to FIG. 2. Health table 200 may be included in sections of a memory array associated with personal or payload data, or as metadata. In other embodiments, health table 200 may be stored separately from memory device 130 and accessible by the one or more memory controllers 120 according to this disclosure.

According to the disclosed embodiments, and as discussed in further detail below, health table 200 includes a plurality of health information indicating a health status, or other related information, corresponding to particular physical sections of a memory array of memory device 130. Health table 200 is accessible by the one or more controllers 120 and may be used to determine an appropriate programming or read method to be performed for particular physical sections of memory device 130. Health table 200 may also be accessed by one or more controllers 120 to perform error correction processes, a wear-leveling process or other processes according to the disclosed embodiments.

Health table 200 according to an exemplary embodiment, and as shown in FIG. 2, may include a plurality of rows, such as a row 202 including information identifying particular physical sections or units (PU-'0', . . . , PU-'Y') of memory device 130, a row 204 including information identifying health or other related information corresponding to the particular physical sections of row 202, and a row 206 including information identifying an address corresponding to the particular physical sections of memory device 130. Health table 200 according to the exemplary embodiments may include additional information including other addressing or mapping information, as may be desired.

As shown in FIG. 2, health table 200 may include a plurality of columns corresponding to a number of physical sections or units of a memory array. Health table 200 may include a column for each physical section of a memory array or a subset of physical sections, or only those physical sections that are identified as degrading, as may be desired. Health table 200 in FIG. 2 is shown by way of example only. Health table 200 may also provide data for other hierarchical structures of memory device 130, such as a block, or word line, or other physical or logical structure. In some embodiments, health data corresponding to particular physical sections of a memory array may not be arranged in a table structure at all—other known methods for organizing data may be implemented.

Figure 3:
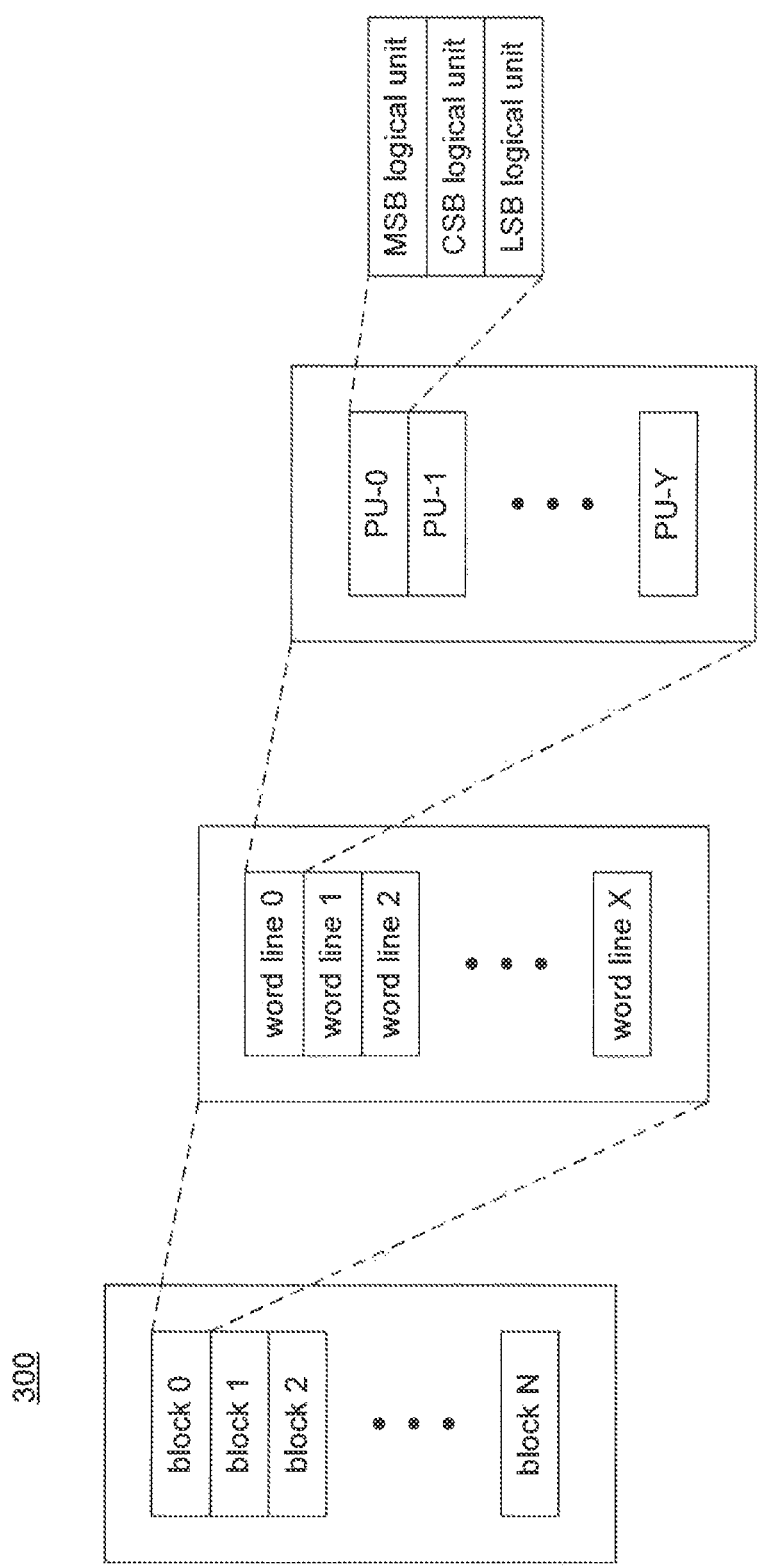
FIG. 3 schematically illustrates a hierarchical structure of an exemplary block of memory cells in a memory.

FIG. 3 illustrates an exemplary hierarchy structure of a block of memory cells of a memory array 300. As shown in FIG. 3, memory array 300 according to an embodiment includes a number of partitions according to the exemplary hierarchical structure. For example, in one embodiment, memory array 300 comprises a plurality (N+1) of blocks, block '0'-block 'N'. In the disclosed embodiments, a block represents the highest level of the hierarchical structure of the partitioned memory array 300. In an exemplary embodiment, one or more of the blocks, block '0' for example, comprises the memory cells of a plurality of word lines, word line '0', . . . , word line 'X.' The plurality of word lines respectively correspond to a plurality of physical pages. In the exemplary embodiment, the memory cells of one or more of the word lines or physical pages are further grouped into one or more physical sections or physical units, PU-'0', . . . , PU-'Y', each including a plurality of individual memory cells. In the disclosed embodiments, a physical section is the smallest level of the hierarchical structure of the partitioned memory array 300. Memory device 130 may be managed at a plurality of levels as desired, for example, at a block level, word line level or a physical section level, or other levels as may be desired according to a particular configuration. In one embodiment, memory device 130 is managed at the physical section level, such that health table 200 includes health data for the plurality of physical sections of a memory array of the memory device 130.

The structural hierarchy of memory array 300, shown in FIG. 3, is by example only. Any hierarchical structure may be implemented in the disclosed embodiments. For example, in one embodiment, a memory array is organized to include only a single block, or less than 'N' blocks, as may be desired. Also, each block may include greater or fewer levels of organization than is shown in FIG. 3. In other embodiments (not shown), a physical page or word line may include only a single physical section. For example, in one embodiment, a word line (or a plurality of word lines) may be the smallest level of the hierarchical structure. In another embodiment (not shown), a single physical section may correspond to one or more physical pages on one or more other memory arrays. The one or more physical pages may have the same physical address in each of the one or more memory arrays. Furthermore, memory array 300 may include other hierarchical sections, including divisions or sectors as these terms are used in the art.

Additionally, one or more hierarchical levels may include logical pages or logical sections/units thereby enabling the memory device to be managed at a logical level as well. For example, depending on the number of bits encoded per memory cell, each physical page may include one or more logical pages. Thus, for a physical page including memory cells encoding three bits per cell (i.e., a TLC cell), the physical page may be subdivided into 3 logical pages, a MSB (most significant bit) logical page, a CSB (center significant bit) logical page, and a LSB (least significant bit) logical page. As shown in the example of FIG. 3, each physical unit (e.g., PU-'0') of the physical page or word line may also include one or more logical units provided as an MSB (most significant bit) logical unit, a CSB (center significant bit) logical unit, and a LSB (least significant bit) logical unit. Thus, each word line or physical page encoded to store 3 bits per cell may include 3 logical pages, each logical page including a number of logical units corresponding to the number of physical units. The disclosed systems and methods may be implemented according to any desired physical or logical hierarchical structure of memory device 130.

Returning to FIG. 2, in an exemplary embodiment, health table 200 is configured to include health information for each physical section or unit (PU-'0', . . . , PU-'Y') of a memory array. According to the exemplary embodiments, the size or length of a physical section or unit of the memory array may vary depending on a desired configuration or operation of memory device 130. For example, in one embodiment, a physical section includes a size corresponding to the level of granularity of a flash memory is translation layer (FTL) function, or a logical-to-physical level mapping/addressing function. In other embodiments, a physical section corresponds to the size of a desired error correction chunk, for example, the size of data on which an error correction function is performed. The size of an error correction chunk may be determined according to a number of factors including the strength of the error correction scheme implemented and the desired number of bits to be corrected for any given chunk of data. In other embodiments, a physical section may comprise a plurality of error correction chunks. In some embodiments, the size of an error correction chunk may correspond to the size of a physical page, such that the size of a physical section also corresponds to the size or length of a physical page. In some embodiments, as shown in FIG. 3, more than one physical section may be included in a physical page.

In some embodiments, each physical section may include multiple logical units. For example, in one embodiment in which the memory cells can be encoded with more than 1 bit of data, the plurality of bits each correspond to a separately addressable logical page. For example, in one embodiment, memory array 300 can be configured as a TLC memory device, where each memory cell encodes 3 bits of data. The 3 bits of data correspond to a most significant bit (MSB), center significant bit (CSB), and a least significant bit (LSB). Even though each of the 3 bits is encoded in a single memory cell, the 3 bits correspond to 3 different independently addressable logical pages included as part of a single physical page. Furthermore, the independently addressable logical pages may be subdivided into logical units corresponding to the number of physical units included in the physical page. For example, the MSB bit of a memory cell of a first physical unit may correspond to a MSB logical unit of the first physical unit, the CSB bit may correspond to a CSB logical unit, and the LSB bit may correspond to a LSB logical unit. Thus, as shown in FIG. 3, the plurality of MSB bits across the plurality of memory cells included in a physical section may form an MSB logical unit. Likewise, the plurality of CSB and LSB bits across the plurality of memory cells included in a physical section may form a CSB logical unit and a LSB logical unit, respectively. In one embodiment, therefore, a program or write operation targeting a physical section may be made to write only the corresponding MSBs, CSBs, or LSBs of the physical section, as may be desired.

Implementation of health table 200, as shown in FIG. 2, according to the exemplary embodiments will now be discussed.

In one embodiment, such as example 'A' shown in FIG. 2, health table 200 stores information corresponding to the number of bits of data to be programmed (i.e. written) or encoded to the individual memory cells of a physical section or unit of a memory array 300. For example, the health data provided in row 204 includes 2 bits of information representing one of four potential health states for each physical section or unit represented in the health table 200. In example 'A', the four health states include a first health state (represented by bits '00') indicating that 3 bits of data are to be written or encoded to the memory cells comprising a physical section. In a second health state (represented by bits '01'), 2 bits of data are to be written to the memory cells comprising a physical section. In the third health state (represented by bits '10'), 1 bit of data is to be written to the memory cells comprising a physical section. In the fourth health state (represented by bits '11'), the physical section is retired, such that no data is to be written to the corresponding memory cells of the physical section.

As shown in health table 200 of FIG. 2, for a single memory array, individual physical sections or units may be designated to be programmed according to different programming methods according to an indicated health state. For instance, a first physical section (PU-'0') is designated to be programmed to store 3 bits per cell, whereas a second physical section (PU-'1') is designated to be programmed to store 2 bits per cell, and a third physical section (PU-'Y') is designated to be programmed to store 1 bit per cell. A fourth physical section (PU-'2') is designated as retired, such that no bits are to be written to the corresponding cells.

In another embodiment, such as 'example B' shown in FIG. 2, health table 200 stores information corresponding to a particular error correction scheme to be implemented for corresponding physical sections or units of a memory array according to a determined health of the physical section. For example, the row of health data 204 includes 2 bits of information representing one of four health states corresponding to error correction schemes to be implemented for a physical section. As shown, in a first health state (represented by bits '00') health data 204 indicates a BCH error correction scheme to be implemented for corresponding physical sections. In a second health state (represented by bits '01') health data 204 indicates a LDPC error correction scheme to be implemented for corresponding physical sections. In a third health state (represented by bits '10') health data 204 indicates that the corresponding physical section is to be written with parity data, or redundant data, for use in correcting errors in other physical sections. Similar to example 'A', in a fourth health state (represented by bits '11') health data 204 indicates that the corresponding physical section is to be retired from further use.

The embodiments of example 'A' and example 'B' are by example only. The number of bits used to indicate health data in row 204 of health table 200 may vary according to a desired operation. For example, in one embodiment, health data can be provided using 3 bits of data corresponding to eight different health states. In such an embodiment, the eight different health states may include some combination of the above described states in examples 'A' and 'B' or may correspond to other states contemplated from the present disclosure. In some embodiments, health data may even be provided using a single bit of data. For example, in one embodiment, a default programming method may be designated, such as to write 2 bits of data per cell. In this embodiment, a '0' bit value of health data indicates that the physical section is to be written with 1 bit of data per cell, whereas a '1' bit value of health data indicates that the physical section is to be retired. The default programming method may be implemented when no data has been written to the health table 200 for a corresponding physical section. Any other of numerous potential variations of health data to be included in an exemplary health table 200 may also be implemented as contemplated by the present disclosure.

Health table 200, as discussed above, may include health data indicating any number of potential "health states" of corresponding physical sections of a memory array as desired according to a particular configuration. In an exemplary embodiment, health table 200 may be implemented, for example, to improve performance of, or increase the life of, memory device 130. For some memory devices 130, certain ones of the plurality of memory cells of a memory array may begin to degrade in performance after numerous read/write/erase operations, for example. Other defects in the manufacture of a memory array or other environmental or operational effects may also contribute to various performance abnormalities of certain ones of memory cells. Health table 200, as implemented in the disclosed systems and methods, can provide information identifying certain physical sections of a memory array that include memory cells that are no longer operable or have degraded in performance.

In the exemplary embodiments, the health data included in health table 200 is accessed by controller 120, for example, indicating to controller 120 to adapt a particular programming and/or encoding method (and read method corresponding to the programming method) or error correction scheme for particular physical sections. The "health state" represented by health data 204 in health table 200 may be determined according to any known manner of detecting the health or a degree of degraded performance of corresponding physical sections of a memory array according to predetermined thresholds or other diagnostic methods.

With respect to example 'A' discussed above and as represented in FIG. 2, health table 200 indicates a degraded physical section or degraded cells of a physical section based on the corresponding health data 204. For example, health data 204 may indicate the number of bits that the memory cells of a physical section can be programmed with. Accordingly, the physical sections with greater health or lesser degree of degradation may be programmed with a greater number of bits, for example.

In this embodiment, memory device 130 is configured such that the plurality of memory cells are capable of being encoded with either 1, 2, or 3 bits of data per cell. And in an optimal state of operation of memory device 130, for example, each (or at least a number above a threshold) of the memory cells of a physical section is capable of storing 3 bits of data per cell. Thus, initially, health table 200 stores health data indicating that the memory cells of each physical section are to be programmed according to an encoding scheme capable of representing 3 bits of data per cell. For example, the health data in row 204 for each physical section is written by controller 120, for example, to store bits '00'. Prior to a write operation, controller 120 may access health table 200 to determine the "health status" of a targeted physical section to be written to, and upon determining that the health data corresponds to bits '00', controller 120 may program the desired physical sections of a memory array according to a programming or encoding method suitable for encoding 3 bits of data per cell. In this embodiment, controller 120 is adaptively configured to perform the write operation to 'write' 3 bits of data per cell.

Figures 4A, 4B:
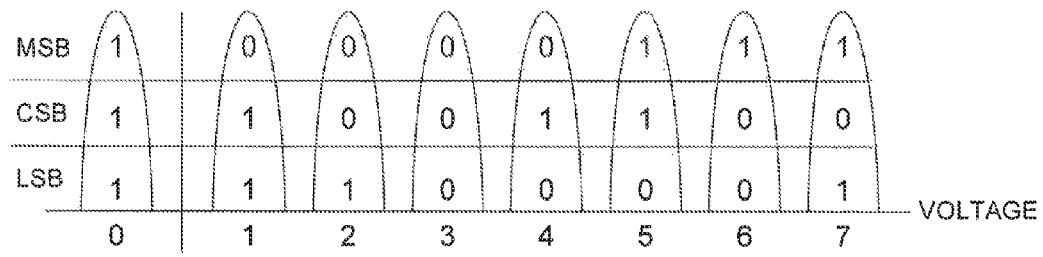
FIGS. 4A and 4B illustrate an exemplary encoding scheme for programming a memory cell.

In one embodiment, controller 120 is configured to program a memory cell by applying a particular voltage to a common word line and/or one or more bit lines of the memory cells of the targeted physical section, as would be understood by one of ordinary skill in the art. For example, as shown in FIGS. 4A and 4B, which illustrate an exemplary coding scheme for programming a memory cell, controller 120 applies a particular voltage to a target memory cell, the particular voltage corresponding to a programming state of the memory cell. For example, as shown in FIGS. 4A and 4B, for a TLC memory cell, 8 discrete voltage levels can be applied to a memory cell corresponding to each of 8 discrete programming states. Additionally, each of the 8 discrete programming states corresponds to a particular bit value according to a desired encoding scheme. The encoding scheme illustrated in FIGS. 4A and 4B is one potential encoding scheme that may be implemented in an exemplary embodiment.

As shown in FIGS. 4A and 4B, a first programming state (state '0') corresponding to the lowest voltage value, is associated with a bit value of "111." A second programming state (state '1') corresponds to bit value "011", a third state (state '2') corresponds to bit value "001", etc. That is, states '0'-'7' correspond to gradually increasing voltage values. Thus, for example, in order to program a target memory cell to store a bit value of '010', controller 120 is configured to apply a voltage to the memory cell corresponding to the voltage value of state '4' according to the implemented encoding scheme. The ability of a memory cell to reliably store a charge corresponding to the applied voltage value of a desired state over time depends on a number of factors, including the age of the memory cell and number of P/E cycles applied to the cell, as well as other environmental and operational factors and effects. In the exemplary embodiments, a memory cell's health corresponds to its ability to store a charge corresponding to a voltage value of the desired state. Over time, a memory cell may no longer be capable of reliably representing 8 discrete voltage levels. Accordingly, the exemplary embodiments adapt suitable programming and/or error correction schemes to extend the use of those memory cells with degrading health.

During operation, health table 200 can be updated to identify certain ones of the plurality of physical sections of a memory array with degrading health, e.g., those that may no longer be reliably programmed with 3 bits of data per cell. The certain ones of the plurality of physical sections with degrading health may be determined based on an identified bit error rate for each physical section, for example. In the exemplary embodiment, instead of retiring the block of the memory array including the degrading physical section (or the physical section itself), health table 200 is updated to indicate a degraded health or state of the corresponding physical sections.

For instance, with respect to example 'A', for a physical section that has been identified as having degraded performance, health table 200 is updated to indicate that the physical section is to be written with 2 bits or 1 bit of data per cell going forward. For example, health data of a particular physical section is updated in health table 200 with bits '01' or '10' as desired. As such, a degrading physical section may still be utilized in the memory array according to a programming method or encoding scheme that still achieves desired reliability. Even though the memory cells of a physical section have degraded such that controller 120 can not reliably read or write 3 bits of data to the memory cells of the physical section, the memory cells may still perform satisfactorily to store 2 bits or 1 bit of data. Controller 120 is adaptively configured to adjust a programming method for a physical section according to the health data in health table 200 to program (e.g. write) 2 bits or 1 bit of data per cell as directed. Accordingly, the storage capacity of a memory array is reduced gradually over time, which leads to an extended life for memory device 130.

Additionally, if it is determined that certain ones of the plurality of physical sections are no longer capable of reliably storing any data, those identified physical sections are retired by updating corresponding health data in health table 200 to include the bits '11', for example. Because the physical sections of the exemplary embodiments may be smaller physical sections in the hierarchical structure of a memory array than a block of the memory array, the retiring of individual physical sections instead of the block including those sections also effectively increases the useful life of a memory device 130. As such, only those physical sections that are no longer capable of effective desired use are retired, thereby enabling memory device 130 to store data in other usable physical sections of a block of the memory array.

As discussed above, in one embodiment, one or more controllers 120, upon accessing health data 204 in health table 200, are configured to adjust a programming or encoding scheme such that fewer than 3 bits of data are to be encoded to targeted memory cells. This may be achieved in a plurality of ways, as contemplated by the present disclosure. In one embodiment, controller 120 is configured to retire one of the logical units corresponding to a degraded physical section. For example, controller 120 is configured to retire one of the MSB, CSB, or LSB logical units of the degraded physical section. In one embodiment, controller 120 is configured to retire the logical unit, the programming of which may be determined to introduce a greater number of bit errors in the memory cell or neighboring cells. In another embodiment, the retired logical unit is selected as dictated by the particular encoding scheme implemented by controller 120. For example, as memory cells degrade, it may be more difficult to distinguish between voltage levels of neighboring states. Thus, controller 120 may be configured to retire the logical unit that results in the remaining states being separated by greater voltage values, as dictated by the encoding scheme.

In one embodiment, for example, it may be determined that programming of the CSB logical unit of a physical section introduces a greater number of bit errors than the programming of an MSB logical unit or an LSB logical unit. Such a determination may be made according to an error correction process or other diagnostic methods or characteristics of the memory array. To retire the CSB logical unit of a physical section, controller 120 may be configured to "fill" the CSB logical unit with all '1's, for example. In the exemplary encoding scheme, shown in FIGS. 4A and 4B, changing the CSB bits to a value of '1' results in remaining programmable states '0', '1', '4' and '5' for the MSB and LSB logical units. The four remaining states represent the 4 states that can be encoded using only 2 bits of data (e.g. '11', '01', '00' and '10'). In this embodiment, according to the implemented encoding scheme, it may be advantageous to "fill" the CSB bits with a value of '1' because doing so eliminates states '6' and '7', the states requiring a greater voltage level to program the targeted memory cells and may thus be more likely to introduce program/read disturbs in neighboring cells. Another advantage includes the ability of controller 120 to maintain the same encoding scheme for the MSB and LSB logical units of the physical section. In other words, the same voltage values may correspond to the same programming states for the MSB bit and the LSB bit whether the memory device is programmed to store 3 bits of data per cell or 2 bits per cell.

In another embodiment, either the MSB logical unit or the LSB logical unit is similarly retired to reduce the capacity of a memory cell from 3 bits per cell to 2 bits per cell. The methods disclosed herein are not limited by any particular manner of retiring a logical unit or reducing the capacity of a memory cell.

Other adaptive programming methods may also be implemented according to the present disclosure. For example, a controller 120 may be configured to adapt an encoding method corresponding to a reduced capacity of the memory cell. For example, distinct from the embodiment disclosed above, a controller 120 may be configured to program a MSB bit and an LSB bit according to adapted voltage levels corresponding to the programming states. For example, as a memory cell degrades, it may be beneficial to increase a "distance" between voltage values of neighboring programming states. In this manner, it is easier to identify the correct programming state. For instance, in the above example, it may be beneficial to increase the "distance" between programming states '0' and '1' and '4' and '5'. As such, controller 120 can be configured to adjust a programming voltage for each of the corresponding states so that the corresponding voltage levels are more easily distinguished in a degrading memory cell.

One advantage to retiring a separately addressable logical unit of a physical section as described above is to simplify a mapping and addressing method implemented by the memory device. For example, upon retiring one of the MSB, LSB or CSB logical units, according to any of the above or other contemplated methods, the mapping and addressing of other non-retired physical sections remains unchanged. However, in some embodiments, a physical section may not include separately addressable logical units among the MSB, CSB and LSB bits. In these embodiments, methods similar to those described above may be implemented to reduce the capacity of the memory cell from 3 bits to 2 bits, or 2 bits to 1 bit per cell. Additionally, controller 120 may be configured to adjust a mapping or addressing method to account for the reduced capacity of each physical section.

In another embodiment, with respect to example 'B' described above and as shown in FIG. 2, health table 200 designates degrading ones of a plurality of physical sections of a memory array based on an error correction scheme implemented for the physical section. In this embodiment, the physical sections are programmed to store any number of bits per cell. In an initial mode of operation, for example, controller 120 implements a first error correction scheme for the data stored in the plurality of physical sections. In this embodiment, the initial error correction scheme may not be very robust, or may be configured to identify and correct a certain minimal number of errors across the physical section. For example, a first relatively light error correction scheme may include the use of a BCH error correction scheme. Health data in health table 200 for the plurality of physical sections is indicated by bits '00', for example, as shown in FIG. 2, to indicate the initial error correction scheme to be used.

Initially, it may be expected that the memory cells of memory device 130 perform at a level with a minimal number of errors. Thus, a relatively light error correction scheme, such as the BCH scheme, for example, may be sufficient to correct the minimal number of expected errors. Over a period of use, or for any number of other reasons, however, certain ones of physical sections of the plurality of physical sections may begin to degrade such that they introduce a greater number of errors. For example, in one embodiment, a controller 120 may determine that the bit error rate of certain physical sections has increased above a certain threshold. Upon such a determination, health data in health table 200 may be updated to designate that a more robust error correction scheme, for example, is to be used for those identified physical sections with a higher bit error rate.

For example, as shown in FIG. 2 with respect to example 'B', health data in health table 200 corresponding to the physical sections with an increased bit error rate may be updated with bits '01' indicating that a more robust error correction scheme such as LDPC is to be used for those physical sections. In this manner, a relatively more robust error correction scheme that is capable of correcting a greater number of errors can be utilized to extend the use of the degrading physical sections of the memory array. The implementation of BCH and LDPC error correction schemes is by example only. Any other error correction schemes may be implemented as is contemplated by this disclosure.

Additionally, a single error correction scheme may be used in the exemplary embodiments. For example, instead of implementing a different scheme, controller 120 may be configured to perform the same or a similar error correction but in a manner capable of correcting a greater number of errors. In one embodiment, an error correction scheme may be modified to generate an error correction code word of greater length, so that a greater number of errors may be corrected for. Any other potential modification or enhancement that is capable of detecting and correcting a greater number of bit errors as certain physical sections of a memory degrade in performance is contemplated by the present disclosure.

In one embodiment, the error correction code word may be computed based on a size or length of data (error correction chunk) that is written into a targeted physical section of the memory array. As such, in one embodiment, either the size or length of the individual physical sections of the memory array is selected based on a desired error correction chunk size or length. In other embodiments, the error correction chunk corresponds to the size or length of a plurality of physical sections. Additionally, the error correction code word may be computed to have a desired size or length, as necessary to correct a desired number of detectable errors. The computed error correction code word is stored in a designated section of a memory array of memory device 130, or elsewhere that is accessible to controller 120.

In one embodiment, controller 120 is configured to determine whether a detected number of errors exceeds a desired predetermined threshold. In some embodiments, the number of detectable (and correctable) errors depends on the particular error correction scheme and the length of the computed error correction code word, for example, as well as other factors. In one embodiment, the desired threshold is selected based on the number of bit errors that are detectable or correctable according to the implemented error correction scheme. For example, a threshold number of bit errors is determined based on a percentage of the bit errors detected and/or corrected. In one embodiment, the threshold number of errors may correspond to 50% or 75% of the number of detectable errors. As such, for an error correction scheme capable of detecting 48 bit errors in a given error correction chunk of data, for example, controller 120 selects the threshold to equate to 24 errors or half the number of detectable errors. Controller 120 then determines whether the number of detected errors in the read data exceeds the threshold. If the threshold number of errors is exceeded, controller 120 updates health table 200 according to any of the above embodiments to indicate that the corresponding physical section is degrading.

Figure 5:
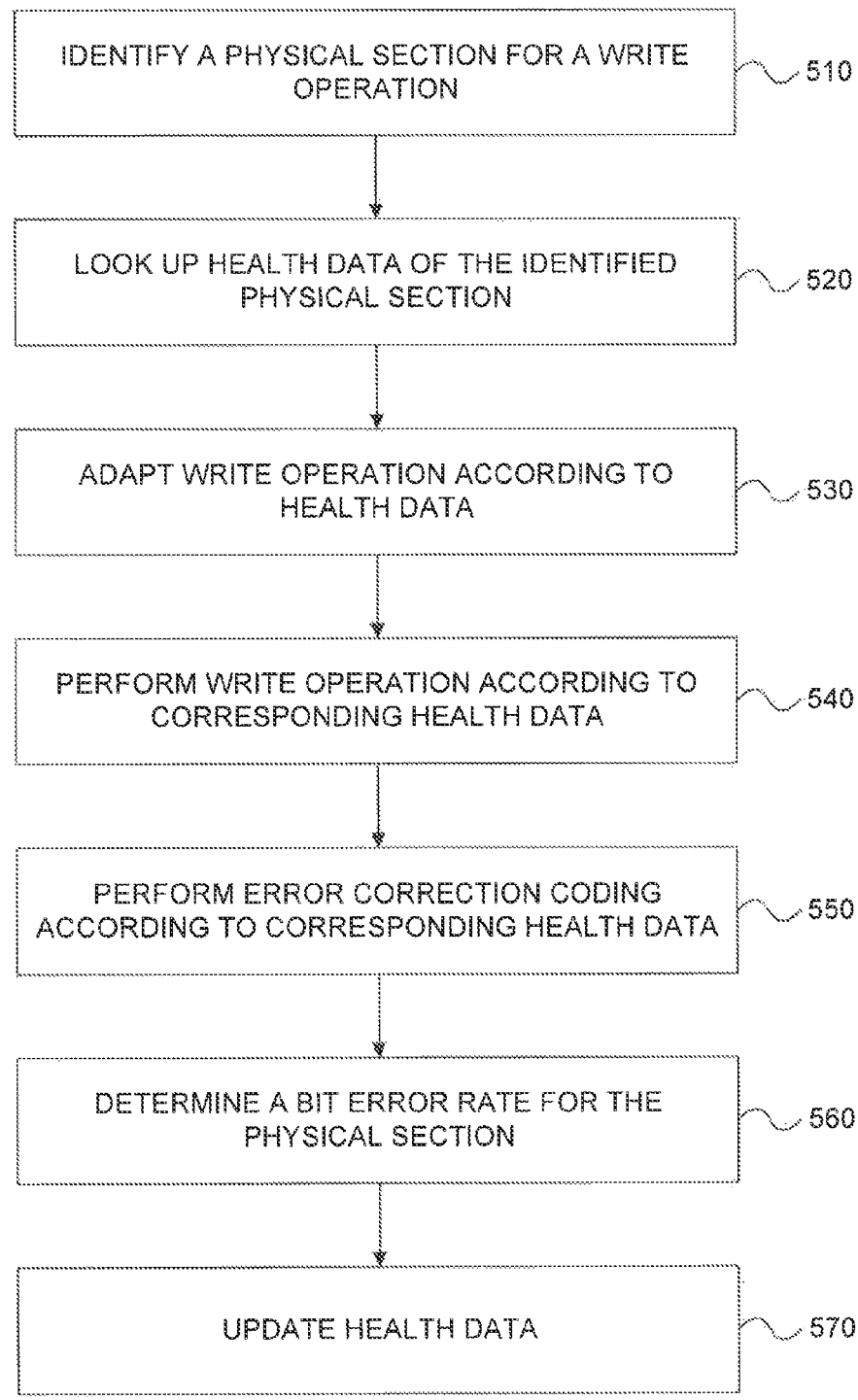
FIG. 5 is a flow chart showing a process according to an exemplary embodiment for programming a physical section of memory according to information in a health table.

An exemplary method 500 for performing a write operation according to the above embodiments is shown in FIG. 5. In the disclosed embodiments, controller 120 may receive a control signal directing a write operation to be performed on a target section of memory device 130. Controller 120 identifies a physical section for the directed write operation (510). Controller 120 identifies the appropriate physical section and the address corresponding to that physical section according to any known method. In one embodiment, a physical section or unit is mapped to a particular address in a look-up table that may be included in health table 200, as shown in row 206 of FIG. 2. Once a physical unit or address of the physical unit is determined, controller 120 looks up health data of the identified physical section (520). In one embodiment, controller 120 accesses health table 200 to look up the corresponding health data. The health data may include an indication of a health state corresponding to the number of bits per cell or an error correction scheme or a combination of both, as described above.

Controller 120 adapts a write operation according to the health data accessed from health table 200 (530). Controller 120 then performs the read/write operation according to the corresponding health data (540). The read/write operation may be adapted according to any of the above described methods, or others contemplated by the disclosure. For example, in operation 540, controller 120 may adapt a write method to write the specified number of bits per cell, as indicated by corresponding health data. As part of operation 530, controller 120 may determine that health data in health table 200 corresponds to a particular error correction scheme, as opposed to a programming method. In this embodiment, controller 120 may be configured to perform a write operation according to a pre-configured programming method.

Additionally, controller 120, following a write operation, generates an error correction code word for performing error correction operations on the written data (550). In one embodiment, an error correction code word is generated according to a pre-configured scheme. The error correction code is word may be stored in any designated section of a memory array as is commonly performed in the art. In another embodiment, health data corresponding to the physical section designates a particular error correction scheme to be implemented. Thus, as part of operation 550, controller 120 performs error correction coding according to corresponding health data for the written physical section. As discussed above, controller 120 may be configured with error correction logic or other circuitry and components configured to perform an error correction operation. Operations 540 and 550 may both be performed by controller 120 for each write operation according to corresponding health data. Or, in some embodiments, only one or the other operation may be performed according to corresponding health data. In those embodiments where health data indicates only a number of bits to be written per memory cell (such as example 'A' shown in FIG. 2), controller 120 may still perform an error correction encoding operation, but the error correction scheme may not change according to a health of a particular physical section.

In the embodiments disclosed above, health table 200 may also be managed and updated by controller 120. In some embodiments, controller 120 is configured to update health table 200 during or after a programming (e.g., write) operation. After a programming operation, such as operation 540, performed for one or more target physical sections, controller 120 may be configured to update health table 200 based on a determined bit error rate for the physical section. For example, following write operation 540, controller 120 determines a bit error rate for the physical section written (560). The bit error rate may be determined according to any known method and include the use of an error correction code word generated in operation 550. Based on the bit error rate determined for the physical section, controller 120 determines whether the physical section should be designated as a degraded section in health table 200. This determination may be made based on whether the bit error rate exceeds a predetermined threshold. If controller 120 determines the physical section is degraded, controller 120 updates corresponding health data in health table 200 accordingly (570).

In one embodiment, health data in health table 200 may be pre-filled according to a desired initialized operation. As such, an initial error correction scheme may be predetermined according to a desired operation of memory device 130. Additionally, an initial desired programming operation may also be predetermined (e.g. 1, 2, 3, or more bits per cell). These initialized configurations may be pre-programmed in health table 200 or controller 120 may be initialized to perform according to the desired operation. Thus, in one embodiment, controller 120 is configured to either update health table 200 after a first write operation or, alternatively, controller 120 populates health table 200 after each initial operation on a physical section.

In one embodiment, controller 120 is configured to update health table 200 after (or together with) a read operation performed on a previously programmed physical section. In one embodiment, controller 120 is configured to access health table 200 to determine an appropriate read operation based on the health data. For example, controller 120 may be configured to adapt a read operation based on the number of bits stored per memory cell. Additionally, controller 120 may be configured to adapt an error correction scheme to correct read errors based on a stored error correction code word and the particular scheme designated by health data in health table 200. Controller 120 is able to determine whether any errors are detected in the read data based on the computed error correction code word corresponding to the read data. In this embodiment, error detection is performed according to any known method, and dictated according to the particular error correction scheme implemented. If controller 120 determines that the number of detected errors exceeds a predetermined threshold, for example, controller 120 updates health data corresponding to the physical section to designate the section as a degraded section.

In one embodiment, prior (or subsequent) to degrading the physical section in health table 200, controller 120 is configured to re-locate the data stored in the degrading physical section to another section of memory. The re-location section in the memory array is selected based on health data stored in health table 200. In this manner, health table 200 is used as part of a wear-leveling method. As such, upon identifying a degrading physical section, controller 120 performs a wear-leveling process to re-locate the data stored in the degrading physical section to another physical section indicated as having a greater health status. For example, controller 120 may access health table 200 to identify other physical sections that have not yet been degraded in the health table 200, or are otherwise indicated as having a greater health status. Upon re-locating the stored data to the identified "stronger" physical sections, controller 120 updates health table 200 to indicate a degraded physical section according to any of the above embodiments. For example, the physical section may be degraded such that corresponding health data indicates that a fewer number of bits per cell are to be written to the memory cells of the corresponding physical section during a next programming operation.

In another embodiment, controller 120 is configured to perform a diagnostic process independent of a read or write operation to identify certain ones of the plurality of physical sections that are degrading in performance. For example, in one embodiment, controller 120 is configured to perform a diagnostic operation to identify certain ones of a plurality of physical sections that exhibit a number of bit errors that exceeds a desired threshold for the physical section. The diagnostic operation is performed according any known method. In one embodiment, as part of a diagnostic operation, controller 120 is configured to write all cells in a physical section according to a single desired state, such as state 6 (shown in FIGS. 4A and 4B), for example. Following the diagnostic write operation, controller 120 is configured to read the stored charge from each of the written cells to identify a number of errors. In this embodiment, the voltage level corresponding to state 6 is an advantageous diagnostic voltage level because of the possibility of introducing an accelerated charge state in degrading cells, one that has migrated to state 7, without potentially introducing errors on neighboring cells. Thus, in this embodiment, the number of memory cells exhibiting a charge state 7 is identified and controller 120 determines whether the number exceeds an error rate threshold. If the number of errors does exceed a predetermined threshold, controller 120 is configured to update health table 200 to indicate the degraded health state of the physical section according to any of the embodiments discussed above.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for controlling programming of a non-volatile memory including at least one block partitioned into a plurality of physical sections, each of the physical sections including a plurality of memory cells, the apparatus comprising:
a controller configured to:
access a health table including health data corresponding to individual ones of the plurality of physical sections;
identify a first programming method for a first physical section of the plurality of physical sections according to the health data in the table corresponding to the first physical section, and identify a second programming method for a second physical section of the plurality of physical sections according to the health data in the table corresponding to the second physical section; and
program the first and second physical sections according to the first and second programming methods for the first and second physical sections, respectively;
wherein the health data corresponds to a health status of the individual ones of the physical sections, and wherein the controller is further configured to determine that a bit error rate for a third physical section exceeds a predetermined threshold, and update the health data in the table corresponding to the third physical section to degrade a health status of the third physical section;
wherein the controller is further configured to determine the bit error rate for the third physical section following programming of the third physical section; and
wherein the controller is further configured to identify, based on the health data in the table, a fourth physical section of the plurality of physical sections of the memory with a greater health status relative to the degraded status of the third physical section when the controller determines that the bit error rate for the third physical section exceeds the predetermined threshold, and relocate the programmed information to the identified fourth physical section of the memory with the greater relative health status.

2. The apparatus of claim 1, wherein the first programming method corresponds to an encoding scheme for programming a first plurality of bits of data at each of the plurality of memory cells of the first physical section, and the second programming method corresponds to an encoding scheme for programming a second, lesser plurality of bits of data at each of the plurality of memory cells of the second physical section.

3. The apparatus of claim 1, wherein the health data in the table includes information indicating a number of bits per memory cell to be written to the plurality of memory cells of the individual ones of the plurality of physical sections.

4. The apparatus of claim 1, wherein, as part of the first programming method, the controller is configured to generate an error correction code word using a first error correction scheme, and as part of the second programming method the controller is configured to generate an error correction code word using a second error correction scheme different from the first error correction scheme.

5. The apparatus of claim 1, wherein each of the plurality of physical sections comprises a plurality of logical pages, and wherein the first programming method programs each of the logical pages of the physical section and the second programming method programs a fewer number of logical pages of the physical section.

6. The apparatus of claim 1, wherein the controller is configured to program one or more of the plurality of physical sections to include the table and the health data.

7. A method for programming a non-volatile memory including a plurality of blocks, each block including a plurality of physical sections, each of the plurality of physical sections including a plurality of memory cells, the method comprising:
receiving a control signal for a programming operation on one or more of the physical sections;
accessing a health table including health data corresponding to individual ones of the one or more physical sections;
identifying a first programming method for a first physical section of the one or more physical sections according to the health data in the table corresponding to the first physical section, and identifying a second programming method for a second physical section of the one or more physical sections according to the health data in the table corresponding to the second physical section; and
programming the first and second physical sections according to the first and second programming methods for the first and second physical sections, respectively,
wherein the health data corresponds to a health status of the individual ones of the physical sections, the method further comprising:
determining that a bit error rate for a third physical section exceeds a predetermined threshold, and updating the health data in the table corresponding to the third physical section to degrade a health status of the third physical section;
determining the bit error rate for the third physical section following programming of the third physical section; and
identifying, based on the health data in the table, a fourth physical section of the plurality of physical sections of the memory with a greater health status relative to the degraded health status of the third physical section when the bit error rate for the third physical section exceeds the predetermined threshold, and relocating the programmed information to the identified fourth physical section of the memory with the greater relative health status.

8. The method of claim 7, wherein the first programming method corresponds to an encoding scheme for programming a first plurality of bits of data at each of the plurality of memory cells of the first physical section, and the second programming method corresponds to an encoding scheme for programming a second, lesser plurality of bits of data at each of the plurality of memory cells of the second physical section.

9. The method of claim 7, wherein the health data in the table includes information indicating a number of bits per memory cell to be written to the plurality of memory cells of the individual ones of the plurality of physical sections.

10. The method of claim 7, further comprising, as part of the first programming method, generating an error correction code word using a first error correction scheme, and, as part of the second programming method, generating an error correction code word using a second error correction scheme different from the first error correction scheme.

11. The method of claim 7, wherein each of the plurality of physical sections comprises a plurality of logical pages, and wherein the first programming method includes programming each of the logical pages of the physical section and the second programming method includes programming a fewer number of logical pages of the physical section.

12. The method of claim 7, further comprising programming one or more of the plurality of physical sections to include the table and the health data.

13. A system for controlling programming of memory, the system comprising:

a non-volatile memory device including at least one block partitioned into a plurality of physical sections, each of the physical sections including a plurality of memory cells;

a health table including health data corresponding to a health status of individual ones of the plurality of physical sections; and a controller for controlling programming of the non-volatile memory device, the controller being configured to:

receive a control signal for a programming operation on one or more of the physical sections;

access the health table to identify health data corresponding to the one or more physical sections;

identify a first programming method for a first physical section of the one or more physical sections according to the health data corresponding to the first physical section, and identify a second programming method for a second physical section of the one or more physical sections according to the health data corresponding to the second physical section; and program the first and second physical sections according to the first and second programming methods for the first and second physical sections, respectively, wherein the controller is further configured to determine that a bit error rate for the first or second physical section exceeds a predetermined threshold, and update the health data in the table corresponding to the respective physical section to degrade a health status of that physical section;

wherein the controller is further configured to determine the bit error rate for the third physical section following programming of the third physical section; and wherein the controller is further configured to identify, based on the health data in the table, a fourth physical section of the plurality of physical sections of the memory with a greater health status relative to the degraded status of the third physical section when the controller determines that the bit error rate for the third physical section exceeds the predetermined threshold, and relocate the programmed information to the identified fourth physical section of the memory with the greater relative health status.

* * * * *